(12) United States Patent
Kim

(10) Patent No.: US 6,324,119 B1
(45) Date of Patent: Nov. 27, 2001

(54) DATA INPUT CIRCUIT OF SEMICONDUCTOR MEMORY DEVICE

(75) Inventor: Chi-wook Kim, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/557,619

(22) Filed: Apr. 25, 2000

(30) Foreign Application Priority Data

May 11, 1999 (KR) .................................................. 99-16747

(51) Int. Cl.[7] ........................................................ G11C 7/00
(52) U.S. Cl. ............................................. 365/233; 365/222
(58) Field of Search ..................................... 365/222, 233, 365/230.6, 230.08

(56) References Cited

U.S. PATENT DOCUMENTS 5,583,818 * 12/1996 You et al. ............................ 365/222

* cited by examiner

Primary Examiner—Terrell W. Fears
(74) Attorney, Agent, or Firm—Volentine Francos, P.L.L.C.

(57) ABSTRACT

A data input circuit of a semiconductor memory device is disclosed. The data input circuit includes a control signal generation circuit, an internal strobe generation circuit and a data setup circuit. The control signal generation circuit generates a strobe control signal activated during input of data of the predetermined burst length. The internal strobe generation circuit generates an internal data strobe signal. The internal data strobe signal synchronizes with an external data strobe signal, and is disabled when data of the predetermined burst length is input. The data setup circuit converts sequentially input data to parallel data in response to the internal data strobe signal. According to the data input circuit and the data input method of the present invention, data of "high"-impedance cannot be input to the semiconductor memory device.

10 Claims, 12 Drawing Sheets

DATA INPUT CIRCUIT OF SEMICONDUCTOR MEMORY DEVICE

This application relies for priority upon Korean Patent Application No. 99-16747, filed on May 11, 1999, the contents of which are herein incorporated by reference in their entirety.

BACKGROUND OF THE INVENTION

The present invention relates to a semiconductor integrated circuit, and more particularly, to a circuit for inputting data to or outputting data from a synchronous dynamic random access memory (DRAM).

A semiconductor memory device used as a main memory of a computer system continually performs operations involving inputting and outputting data to and from memory cells. The data input and output speed of the semiconductor memory device can therefore be very important for determining the speed of operation of the computer system.

In a synchronous DRAM (SDRAM), internal circuits may be controlled in synchronization with an external clock signal generated by an external system. The SDRAM can be classified as either a single data rate SDRAM (SDR SDRAM) or a double data rate SDRAM (DDR SDRAM). In an SDR SDRAM, one piece of data is input or output during a single clock cycle in response to a rising edge of the external clock signal. In comparison, a DDR SDRAM, inputs or outputs two data items during a single clock cycle in response to rising and falling edges of the external clock signal.

As a result of it's higher speed, a DDR SDRAM includes a data input circuit for converting data that is serially input in response to the rising and falling edges of the external clock signal, into parallel data.

In an SDR SDRAM, input data is set up in synchronization with an external system clock signal, while in a DDR SDRAM, input data is set up in synchronization with a data strobe signal input through a data strobe pin. Also, in the SDR SDRAM, valid data is set up as one bit of data for each data pin during the period of an external system clock cycle, or in the DDR SDRAM, the valid data is set-up as one bit of data for each data pin during the period.

In an SDR SDRAM, the write latency is zero. This means that an SDRAM memory device writes in synchronization with the clock signal during which the data input is set up. However, in a DDR SDRAM, the SDRAM memory device writes in synchronization with the clock signal immediately after the clock period during which the data input is set up.

FIG. 1 is a circuit diagram of a data input circuit 100 of a conventional DDR SDRAM. This data input circuit 100 a data input buffer 101, a data strobe buffer 103, an internal strobe generation circuit 105, and a data setup circuit 107.

The data input buffer 101 buffers externally input data $D_{EXT}$ to generate internal data $D_{INT}$. The data strobe buffer 103 buffers an externally input data strobe signal $DS_{EXT}$ to generate an initial data strobe signal $DS_{INITIAL}$. The internal strobe generation circuit 105, delays the initial data strobe signal $DS_{INITIAL}$ for a predetermined period of time to generate an internal data strobe signal $DS_{INT}$. The data setup circuit 107 receives the internal data $D_{INT}$, the internal data strobe signal $DS_{INT}$, and an internal clock signal ICLK, and outputs delayed data as parallel data $D_F$ and $D_S$.

The signal $P_{VCCH}$, is provided to the data setup circuit 107 to prevent the internal node of the chip from a misoperation and invalid latch phenomenon during power-up. $P_{VCCH}$ is maintained at a "low" state when the power voltage is under about 1.5 V, and is transited to a "high" voltage state when the power voltage rises above about 1.5 V.

The internal strobe generation circuit 105 is composed of a chain of several resistors 110, capacitors 115, and inverters 120, as shown in FIG. 2.

FIG. 3 is a circuit diagram of the data setup circuit 107 of the conventional data input circuit of FIG. 1. FIG. 4 is a timing diagram of a main terminal in the conventional data input circuit when the data burst length is 4.

The data setup circuit 107 of FIG. 3 includes a delay unit 301, multiple resistors 302, inverters 304, transistors 306, and transmission gates 310. First and second transmission gates 314 and 312 are discussed in detail below.

The delay unit 301, which delays internal data $D_{INT}$ for a period of time to generate delayed data $D_{DELAYED}$, is itself composed of a multiplicity of inverter chains and capacitors. The delayed data $D_{DELAYED}$, which is sequentially input, is controlled by the internal data strobe signal $DS_{INT}$ and an internal clock signal ICLK, as shown in FIG. 4. The controlled, delayed data is output as parallel data $D_F$ and $D_S$. Signals DSDA and DSBI are related to the signal $DS_{INT}$. The signal $D_{INT}$ is set up due to the signals DSBI and DSDA.

As shown in FIG. 4, an input command is generated during the activation of the first external clock cycle CLK1, i.e., the /WRITE signal is activated to low. The first and second data $D_1$ and $D_2$ are prepared to be propagated in synchronization with the second external clock cycle CLK2, and output as $D_F$ and $D_S$ in synchronization with the third external clock cycle CLK3. Third and fourth data $D_3$ and $D_4$ are set up in synchronization with the third external clock cycle CLK3, and output as $D_F$ and $D_S$ in synchronization with the fourth external clock cycle CLK4.

Here, the internal clock signal ICLK is generated in synchronization with an external system clock signal CLK. The internal clock ICLK goes "high" in response to the rising edge of the external clock signal CLK. The internal clock signal then goes "low" after a predetermined time period.

In the conventional data input circuit of FIGS. 1 through 3, the data setup circuit 107 includes a delay unit 301, and the internal strobe generation circuit 105 includes a delay circuit composed of a chain of inverters and capacitors.

In the DDR SDRAM, a post-amble interval, i.e., the interval from the point that the signal $DS_{EXT}$ goes "low" for receiving the last $D_{INT}$ to the point that the signal $DS_{EXT}$ goes to a tri-state, is a ½ clock cycle of the external clock signal CLK. Thus, when an interval of half the clock cycle of the external clock signal CLK has passed after a time point $T_4$, indicating the input of the fourth data $D_4$, a data strobe signal $DS_{EXT}$ may move to a high impedance state. The time $T_1$, indicating the input of the first data, is a data set up time period $t_{DQSS}$ from the rising edge of the external clock signal to the low transition point of the signal $DS_{EXT}$.

However, because the internal strobe generation circuit 105 includes a delay circuit, the internal clock signal ICLK becomes high at a point in time at which the internal data strobe signal $DS_{INT}$ is in an unknown state. The transmission gates 312 and 314 are turned off to prevent the transfer of invalid data to nodes N315 and N317. This can prevent the output of an unknown state of the two parallel data $D_F$ and $D_S$.

Unless the conventional data input circuit has the internal strobe generation circuit 105 and the delay unit 301, as shown in FIG. 5, the internal data strobe signal $DS_{INT}$ is in the unknown state before the fourth clock cycle CLK4 is high. Thus, the two parallel data $D_F$ and $D_S$ generated by the fourth clock cycle CLK4 of the CLK signal are output in the unknown state instead of the third and fourth input data $D_3$ and $D_4$. In particular, FIG. 5 shows the problems associated with a write mode on low frequency.

Due to the internal strobe generation circuit 105 of the conventional data input circuit and the delay time due to the delay unit 301 of the data setup circuit 107, the delay time may vary according to the temperature or the operational voltage. Therefore, the data input setup margin may be deficient, as shown in both FIGS. 5 and 6.

SUMMARY OF THE INVENTION

It is an object of the present invention to provide a data input circuit with an increased data input setup margin.

To achieve the above object, the data input circuit according to an aspect of the present invention includes a control signal generation circuit that receives burst length information, input command signals, and generates a strobe control signal that is activated during the input of data of a predetermined burst length, an internal strobe generation circuit, enabled in response to the strobe control signal, that synchronizes with an external data strobe signal to generate an internal data strobe signal that is disabled when data of a predetermined burst length is input, and a data setup circuit for converting sequentially received data bits into parallel data bits in response to the internal data strobe signal.

The control signal generation circuit may itself include an input controller for receiving the input command signals and supplying the strobe control signal and a counter control signal, and a burst counter, enabled in response to the counter control signal, for counting a number of external data bits sequentially received and supplying the counted number, as one or more counting signals, to the input controller. The counter control signal is preferably enabled in response to a first input clock signal after one of the input command signals is generated, and is disabled in response to a first clock after a predetermined number of burst data bits are input.

The input controller may itself comprise a counting responding unit for generating a first internal signal in response to the one or more counting signals, the first internal signal representing the predetermined burst length of the input data, a latch unit, enabled in response to one of the input command signals, for latching the first internal signal, and supplying a second internal signal and the strobe control signal, and a counting control signal generation unit, enabled in response to one of the input command signals, for receiving the second internal signal and supply the second internal signal as the counter control signal after a predetermined time. The strobe control signal is preferably generated by inverting the second internal signal.

The latch unit may itself comprise a first logic gate enabled by the second input command signal and responding to the first internal signal, and a second logic gate enabled by the first input command signal and responding to an output of the first logic gate to generate the second internal signal. The first input command signal is preferably generated as a pulse in response to generation of an input command. The second input command signal is preferably activated in response to the generation of the input command, and the activation is preferably maintained during the input of data for the interval of the burst length.

The counting control signal generation unit may itself comprise a first transmission unit for transmitting the second internal signal as a first transmitted signal in response to a first transition of the external clock signal, a first latch for latching the first transmitted signal, a second transmission unit for transmitting the first transmitted signal as a second transmitted signal in response to a second transition of the external clock signal, and a second latch for latching the second transmitted signal to generate the counting control signal. The direction of the first transition is preferably opposite to that of the second transition.

The internal strobe generation circuit may itself include a logic gate, enabled by the strobe control signal, and responding to the external data strobe signal.

The data setup circuit may itself include a strobe response unit for transmitting the sequentially-received data bits through one of two or more paths, in response to the internal data strobe signal, and a clock responding unit for generating the parallel data bits by synchronizing the sequentially-received data bits transmitted through the two or more paths with the external clock signal.

The data input circuit itself may further comprise a data input buffer for buffering the serially-received input data before it is supplied to the data setup circuit, and a data strobe buffer for buffering the strobe control signal before it is supplied to the internal strobe generation circuit.

A method may also be provided for operating a synchronous semiconductor memory device (SDRAM). This method may include receiving a plurality of data bits in response to a predetermined data strobe signal, counting the number of received data bits, and interrupting receipt of the data bits when a number of data bits corresponding to a burst length have been received.

According to the data input circuit and method of the present invention, data of high-impedance cannot be input to the semiconductor memory devices.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Figure 1:
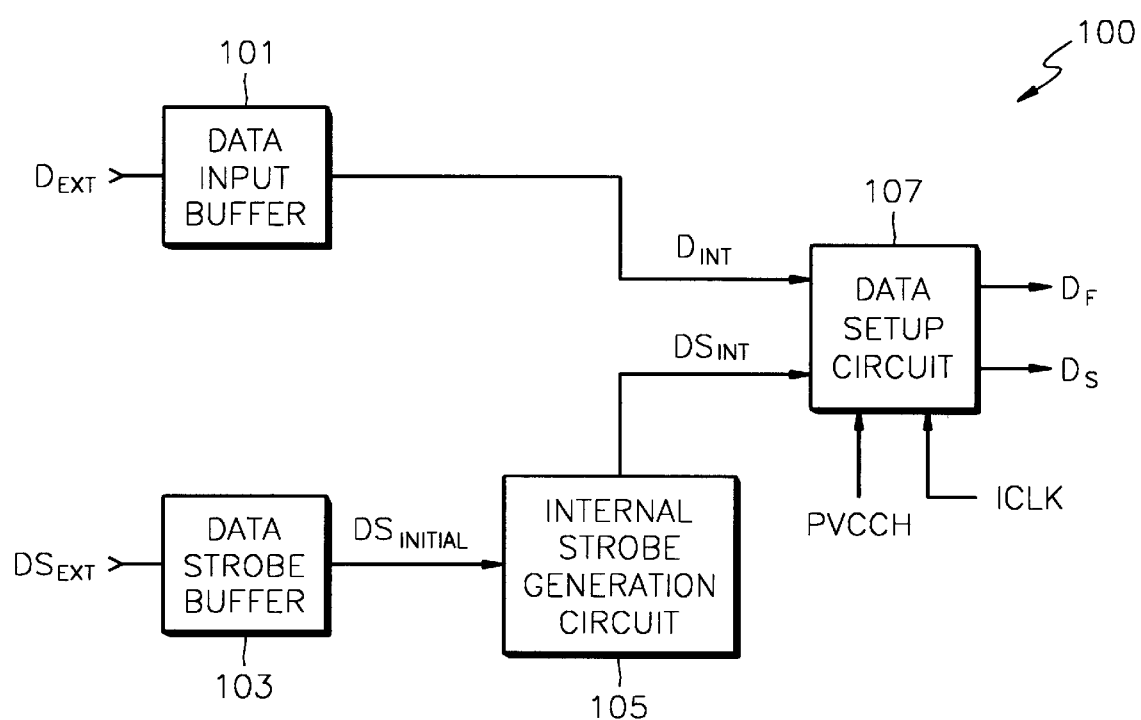
FIG. 1 is a circuit diagram of a data input circuit of a conventional DDR SDRAM.
Figure 2:
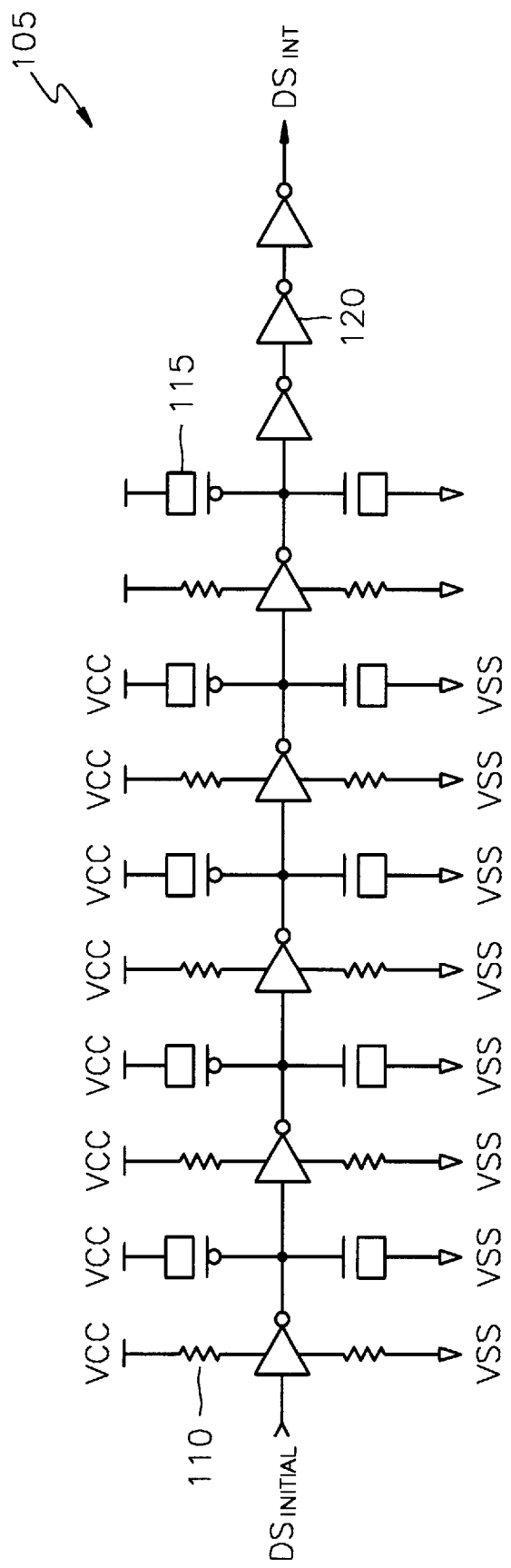
FIG. 2 is a circuit diagram of the internal strobe generation circuit of FIG. 1.
Figure 3:
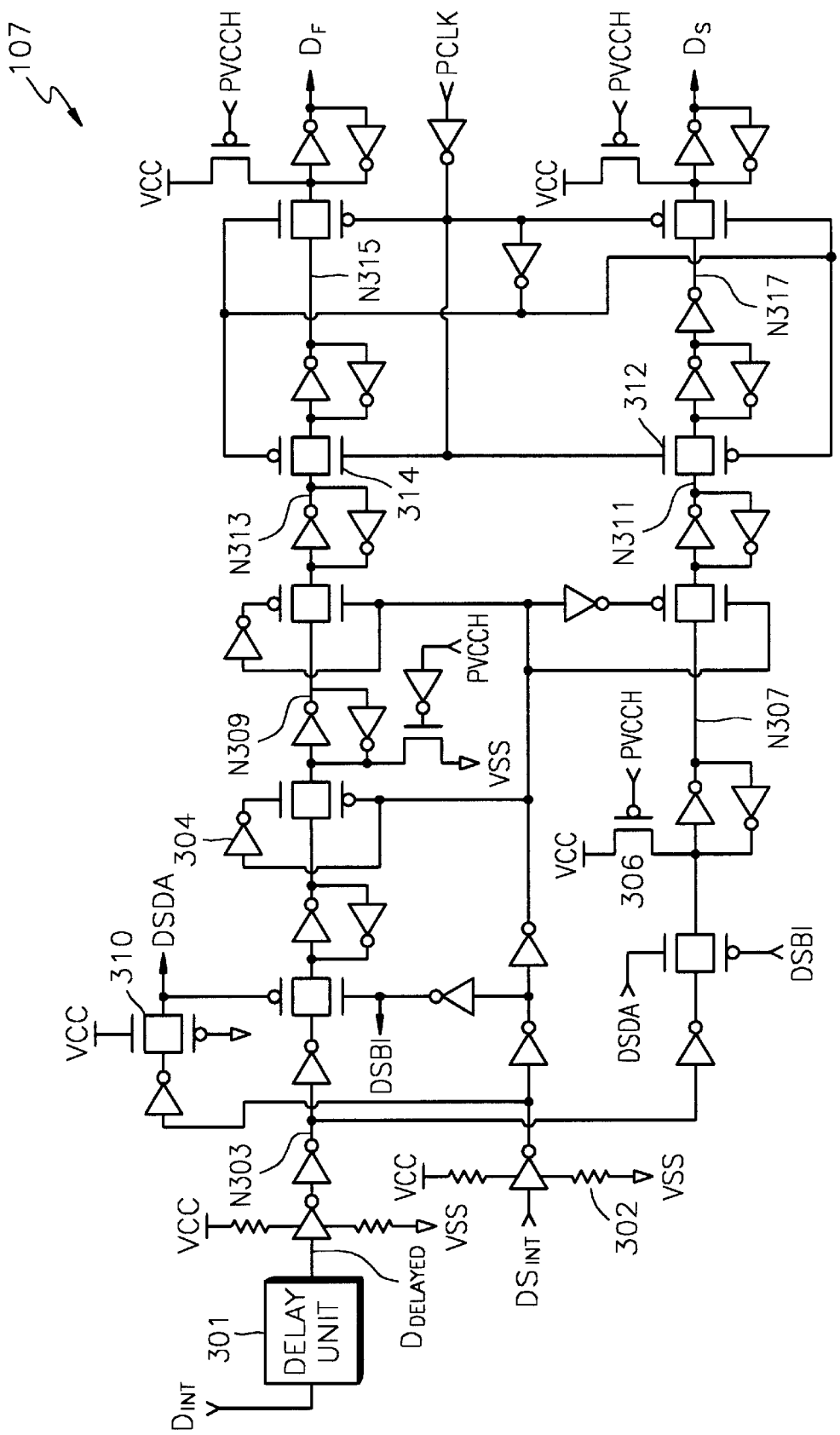
FIG. 3 is a circuit diagram of the data setup circuit of FIG. 1.
Figure 4:
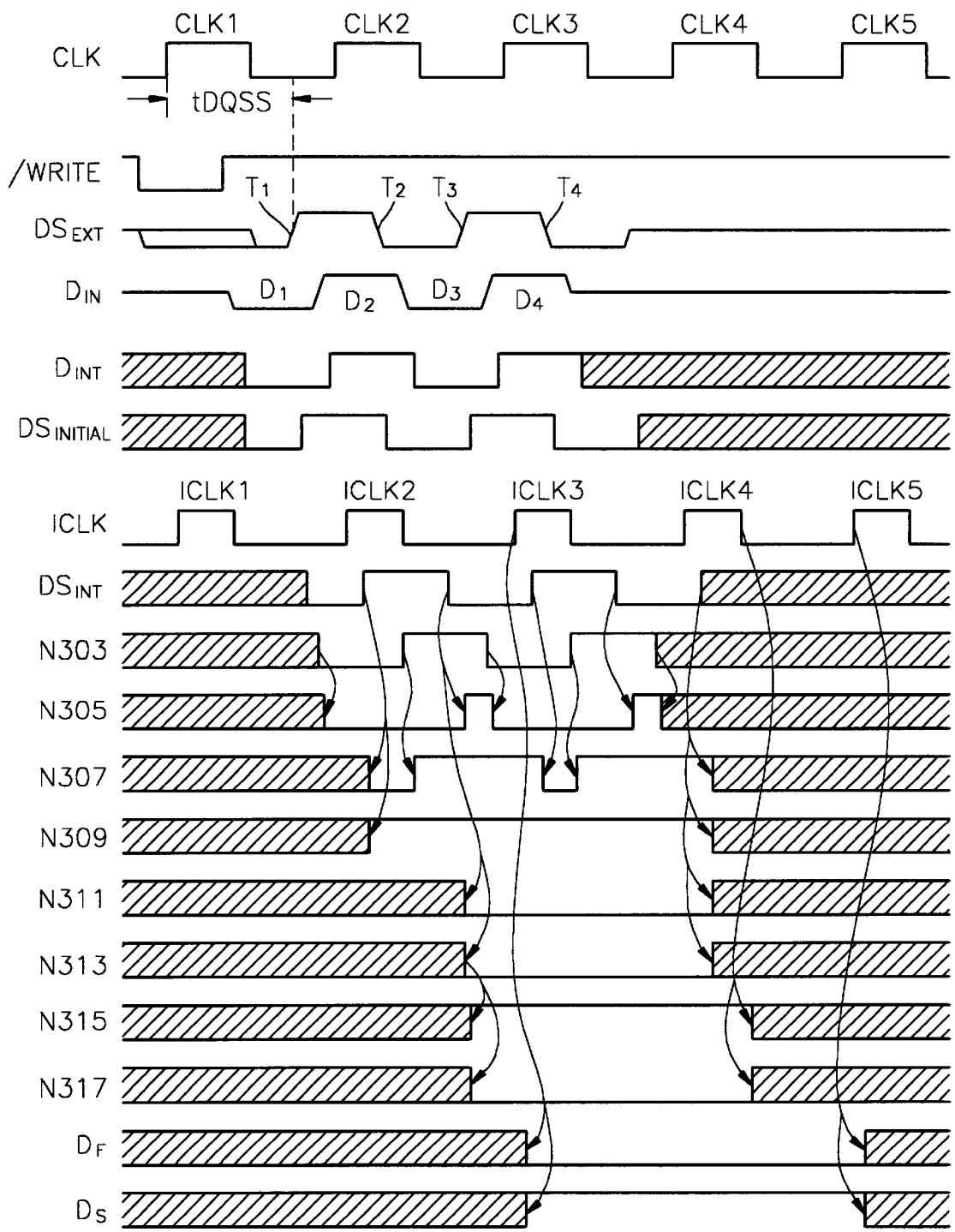
FIG. 4 is a timing diagram of a main terminal, i.e. the significant nodes, of FIG. 3 when the burst length is 4 in the conventional data input circuit.
Figure 5:
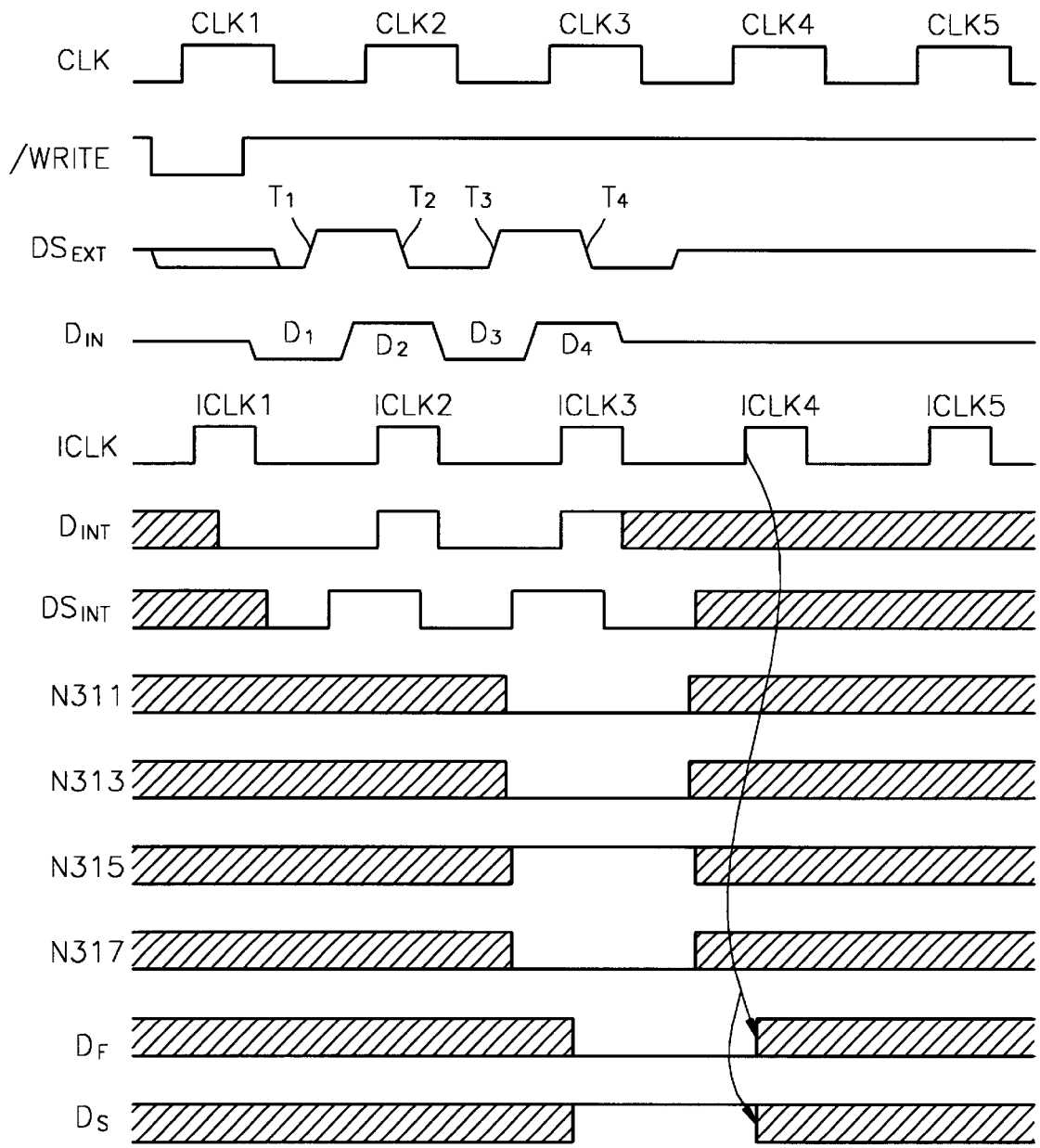
FIG. 5 is a timing diagram that shows a problem with the conventional data input circuit.
Figure 6:
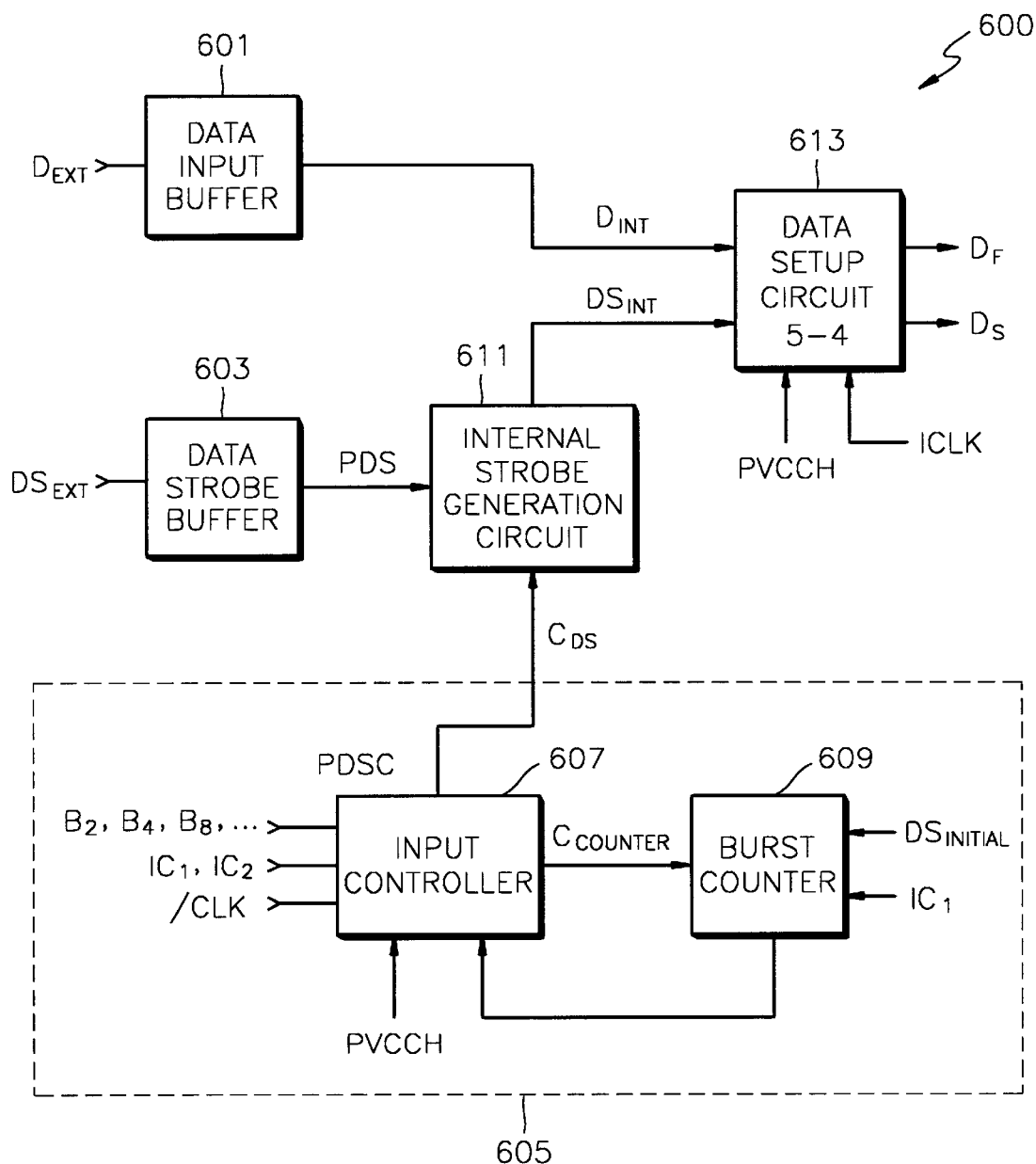
FIG. 6 is a circuit diagram of a data input circuit according to a preferred embodiment of the present invention.

Referring to FIG. 6, a data input circuit 600 according to a preferred embodiment of the present invention includes a data input buffer 601, a data strobe buffer 603, a control signal generation circuit 605, an internal strobe generation circuit 611, and a data setup circuit 613.

The data input buffer 601 buffers externally input data $D_{EXT}$ to generate internal data $D_{INT}$. The data strobe buffer 603 buffers an externally input data strobe signal $DS_{EXT}$ to generate an initial data strobe signal $DS_{INITIAL}$. The data strobe signal $DS_{EXT}$ controls the input of data, and in a double data rate (DDR) mode, one data bit is input or output per transition. The structure and operation of the data input buffer 601 and the data strobe buffer 603 can be understood by a person skilled in the art.

The control signal generation circuit 605 receives first and second input command signals $IC_1$ and $IC_2$ generated by the input command, i.e., the signals /CS, /CAS, and /WE being "low" at the rising edge of the clock signal CLK, input burst signals $B_2$, $B_4$, $B_8$, ..., indicating information on the burst length of the input data, the initial data strobe signal $DS_{INITIAL}$, and the signal $P_{VCCH}$ and generates a strobe control signal $C_{DS}$. The strobe control signal $C_{DS}$ is activated during the input of data of a predetermined burst length. The control signal generation circuit 605 includes an input controller 607 and a burst counter 609.

The input controller 607 receives the burst signals $B_2$, $B_4$, $B_8$, ..., and the first and second input command signals $IC_1$, and $IC_2$, and generates the strobe control signal $C_{DS}$ and the counter control signal $C_{COUNTER}$. Here, the burst signals $B_2$, $B_4$, $B_8$, ..., preferably include information on the burst length of the input data. The first input command signal $IC_1$ is preferably a pulse type signal. The first input command signal $IC_2$ is preferably generated in response to the input command. The second input command signal $IC_2$ is preferably generated in and output from the write control generator.

The strobe control signal CDS is activated during an interval corresponding to the burst length of input data in an input mode, and is supplied to the internal strobe generation circuit 611. The counter control signal $C_{COUNTER}$, which is supplied to the burst counter 609, is activated in response to the first transition of the inverted clock signal /CLK after the input command signal is generated, and deactivated after the predetermined number of data bits are input. Here, the inverted clock signal /CLK is an inversion of an external clock signal CLK (not shown).

The burst counter 609 is enabled in response to the activation of the counter control signal $C_{COUNTER}$. The burst counter 609 receives the first input command signal $IC_1$ and the initial data strobe signal $DS_{INITIAL}$, and thus counts the number of input data bits. The counting signal $CS_i$, which represents the number of the received data (where i=1 to 3), is supplied to the input controller 607.

A combination of the counting signals $CS_i$ (where i=1 to 3), represents the number of the input data, i.e., $CS_1$, $CS_2$, and $CS_3$ represent a binary number that is the number of input data bits. The burst counter 609 will be described in more detail with reference to FIG. 7. The internal strobe generation circuit 611 receives the strobe control signal $C_{DS}$ and the initial data strobe signal $DS_{INITIAL}$, and generates the internal data strobe signal $DS_{INT}$. In other words, the internal strobe generation circuit 611 is enabled in response to the deactivation of the strobe control signal CDS to "low," and thus responds to the data strobe signal $DS_{EXT}$. The internal strobe generation circuit 611 will be described in more detail with reference to FIG. 11.

The data setup circuit 613 is controlled by the internal data strobe signal $DS_{INT}$ and the internal clock signal ICLK, and converts two internal data bits $D_{INT}$ that are sequentially generated by the data input buffer 601 into parallel data bits $D_F$ and $D_S$, to supply the converted parallel data to a memory cell (not shown). The data setup circuit 613 will be described in more detail with reference to FIG. 12.

Figure 7:
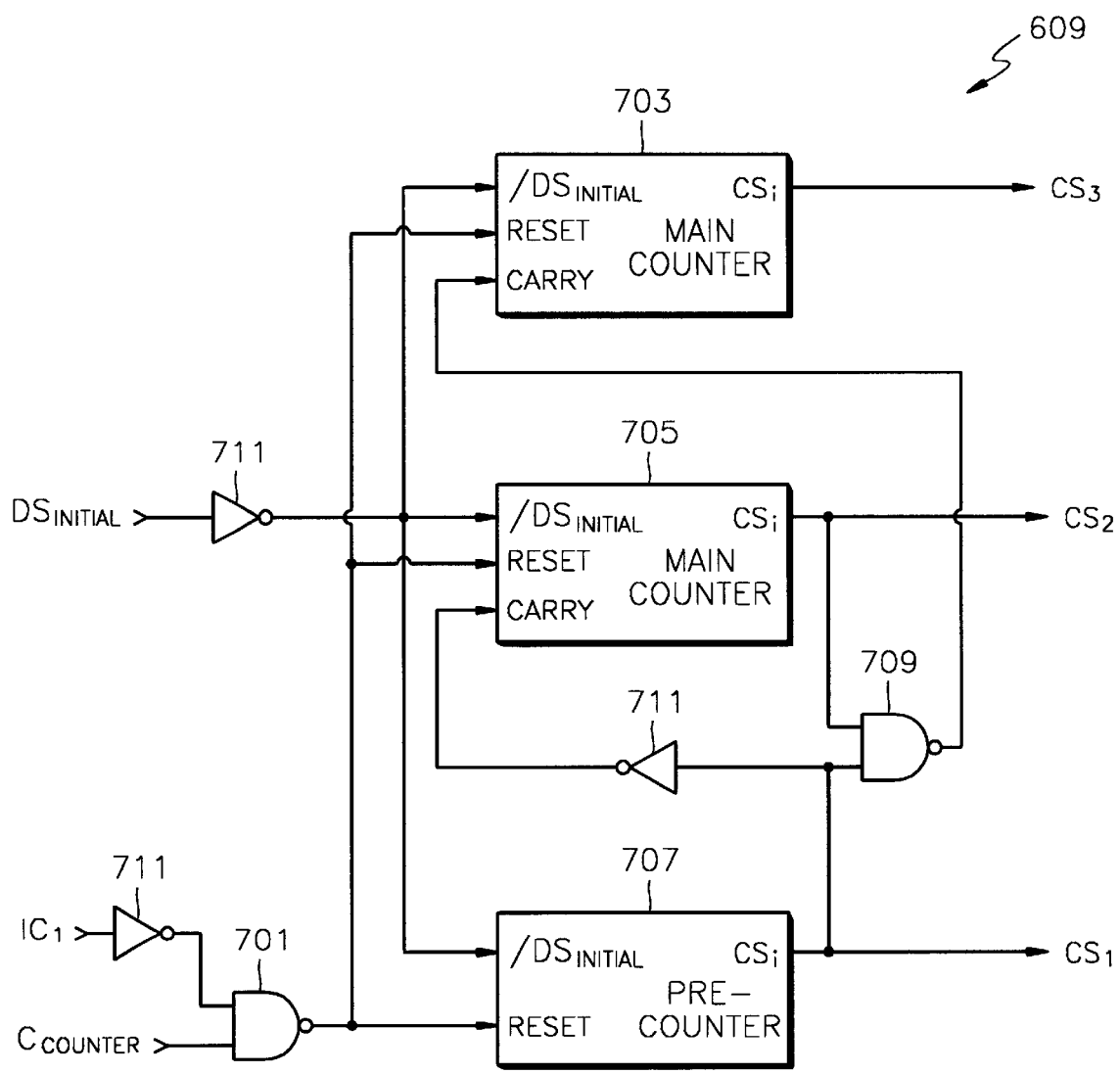
FIG. 7 is a circuit diagram of the burst counter of FIG. 6.

FIG. 7 is a circuit diagram of the burst counter 609 of FIG. 6. In this embodiment, the burst counter uses three bits to count data bursts, an so can count eight data bursts. However, alternate embodiments can use more bits to count larger data bursts. The burst counter 609 of FIG. 7 includes a first NAND gate 701, first and second main counters 703 and 705, one pre-counter 707, a second NAND gate 709, and three inverters 711.

The first NAND gate 701 performs a logical NAND operation on an inverted signal of the first input command signal $IC_1$, and the counter control signal $C_{COUNTER}$. Thus, the pre-counter 707 and the first and second main counters 703 and 705 are reset in response to the inactivation of the counter control signal $C_{COUNTER}$ to "low" or the activation of the first input command signal $IC_1$ to "high." In other words, when the input command is generated, the pre-counter 707 and the first and second main counters 703 and 705 are reset. First to third counting signals $CS_1$–$CS_3$, which are output signals of the pre-counter 707 and the first and second main counters 703 and 705, are reset to "low."

Each counter 703, 705, 707 operates as follows. The /$DS_{INITIAL}$ signal is a signal buffered by an input buffer for each counter. The reset input resets the output to "0," and the carry input indicates whether the a "1" is carried over from the previous counter.

As described above, the initial data strobe signal $DS_{INITIAL}$ represents that the external data are input during the rising and falling transitions in the DDR mode.

Whenever the level transition of the initial data strobe signal $DS_{INITIAL}$ is repeated, data is input from the outside to the inside of the semiconductor device. The level of the first counting signal $CS_1$ is transited on every falling edge of the input initial data strobe signal $DS_{INITIAL}$. Also, the level of the second counting signal $CS_2$ is transited in the state in which a carry signal CARRY of the second main counter 705 is activated to "low," in response to the falling edge of the first counting signal $CS_1$. Also, the level of the third counting signal $CS_3$ is transited in the state in which a carry signal CARRY of the first main counter 703 is activated to "low," in response to the falling edge of the second counting signal $CS_2$.

Figure 8:
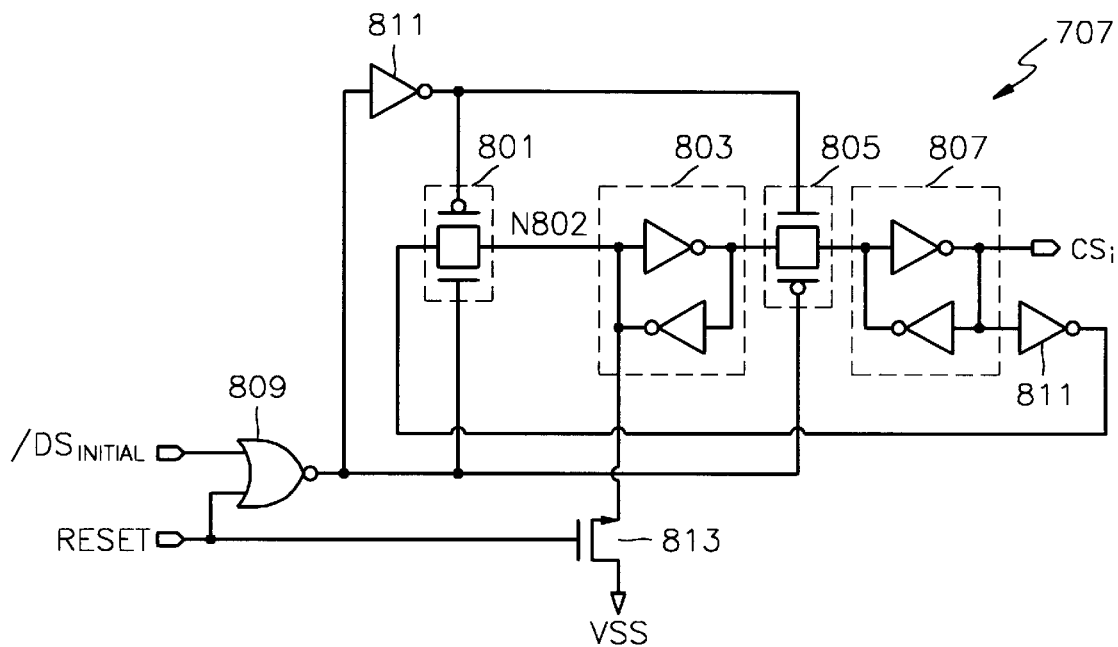
FIG. 8 is a detailed circuit diagram of the pre-counter of FIG. 7.

Referring to FIG. 7, the carry signal CARRY of the second main counter 705 is in a "low" state while the first counting signal $CS_1$ is in a "high" state. The carry signal CARRY of the first main counter 703 is in a "low" state, while the first and the second counting signals $CS_1$–$CS_3$ are in a "high" state FIG. 8 is a detailed circuit diagram of the pre-counter of FIG. 7. Referring to FIG. 8, the pre-counter 707 includes first and second transmitters 801 and 805, first and second latch units 803 and 807, a NOR gate 809, two inverters 811, and a transistor 813. The NOR gate 809 performs a NOR operation on a reset signal RESET and an inverted initial data strobe signal /DS$_{INITIAL}$. The reset signal RESET is connected to an output signal of the NAND gate 701 (see FIG. 7). When the reset signal RESET is disabled to "low," the pre-counter 707 is enabled to respond to the level transition of the inverted initial data strobe signal /DS$_{INITIAL}$. In other words, when the inverted initial data strobe signal /DS$_{INITIAL}$ is level-transited from high to low, the first transmitter 801 is turned on. Similarly, when the inversion signal /DS$_{INITIAL}$ is level-transited from "low" to high, the second transmitter 805 is turned on.

Whenever the inverted signal /DS$_{INITIAL}$ is deactivated, the level of the first counting signal CS$_1$ is transited.

Figure 9:
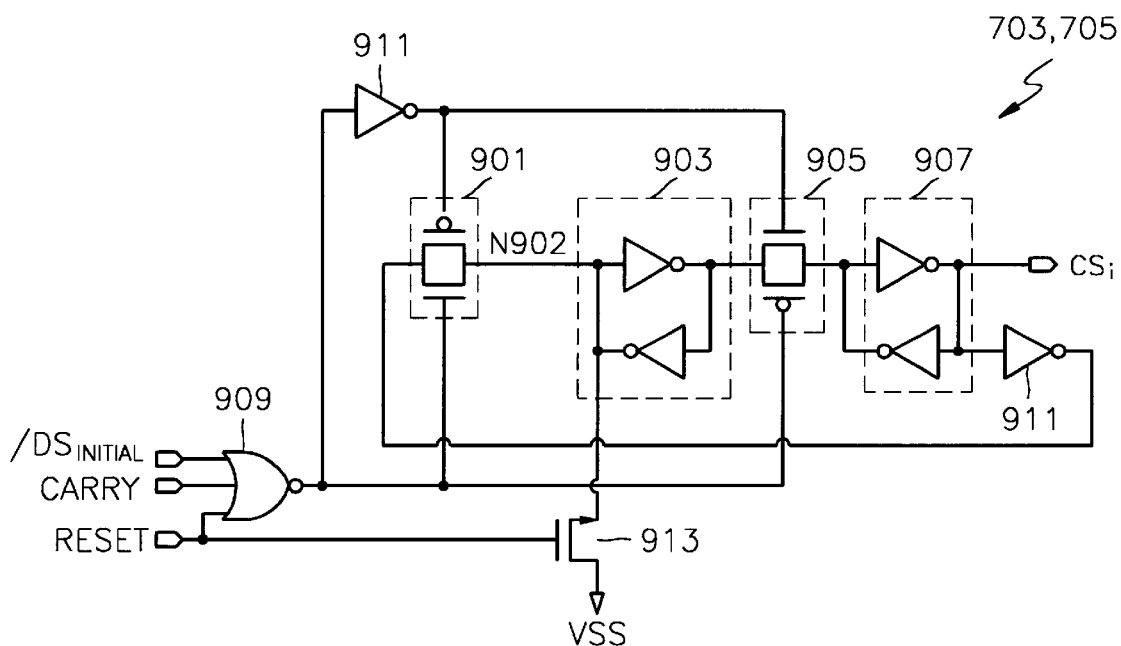
FIG. 9 is a detailed circuit diagram of the main counter of FIG. 7.

FIG. 9 is a circuit diagram of the first and second main counters 703 and 705 of FIG. 7. According to the preferred embodiment, the structures of the first and second main counters 703 and 705 are realized in the same manner. Thus, for convenience, second and third counting signals CS$_2$ and CS$_3$, which are output signals of the main counters 703 and 705, respectively, are represented by a generic counting signal CS$_i$.

The structure and operation of the main counter are similar to those of the pre-counter counter 707 of FIG. 8. As shown in FIG. 9, the first and second main counters 703 and 705 each include first and second transmitters 901 and 905, first and second latch units 903 and 907, a NOR gate 909, two inverters 911, and a transistor 913.

However, the NOR gate 909 in the first and second main counters 703 and 705 has three input terminals, to which the reset signal RESET, the inverted signal /DS$_{INITIAL}$ and the carry signal CARRY are connected. Thus, when the reset signal RESET and the carry signal CARRY are "low," the pre-counter 707 is enabled to respond to the level transition of the inverted signal /DS$_{INITIAL}$. In other words, when the reset signal RESET and the carry signal CARRY are "low," and the inverted signal /DS$_{INITIAL}$ is deactivated, the level of the counting signal CS$_i$ is transited.

Figure 10:
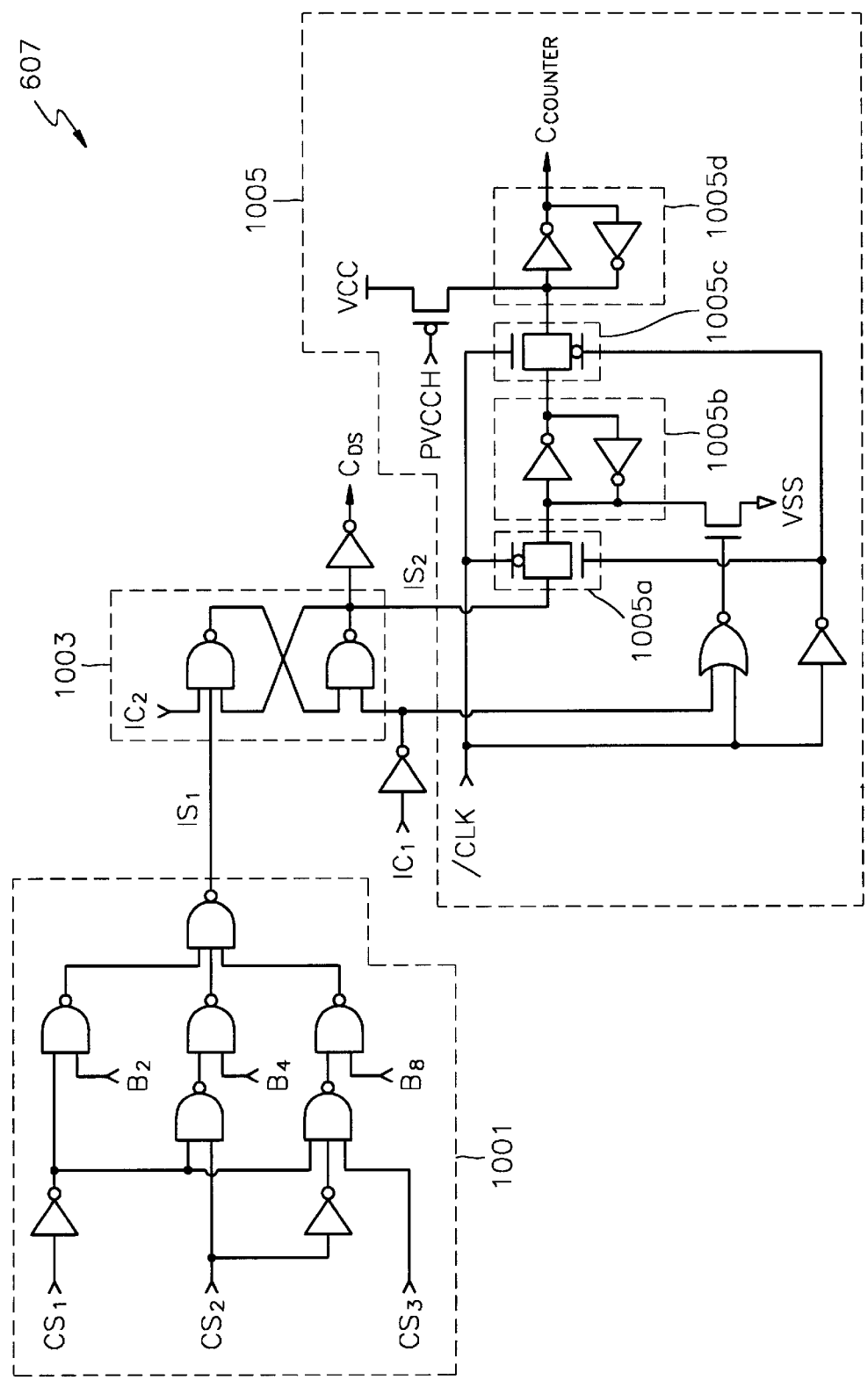
FIG. 10 is a detailed circuit diagram of the input controller of FIG. 6.

FIG. 10 is a circuit diagram of the input controller 607 of FIG. 6. Referring to FIG. 10, the input controller 607 includes a counting responding unit 1001, a latch unit 1003, and a counter control signal generation unit 1005.

The counting responding unit 1001 detects an input data burst. The counting responding unit 1001 changes the level of a first intermediate signal IS$_1$ when a predetermined number of data bits are input.

The latch unit 1003 is enabled while the first input command signal IC$_1$ is in a "high" state, and thus responds to a first intermediate signal IS$_1$ output from the counting responding unit 1001. When the second input command signal IC$_2$ becomes high, a second intermediate signal IS$_2$ output from the latch unit 1003 is latched to high. At this time, a strobe control signal C$_{DS}$, which is an inversion of the second intermediate signal is activated to "low." Even if the first input command signal IC$_1$ becomes "low," the second intermediate signal IS$_2$ output from the latch unit 1003 is kept high.

When the second input command signal IC$_2$ is high, and a predetermined number of data bits are input, and thus the level of the first intermediate signal IS$_2$ output from the counting responding unit 1001 is changed, the second intermediate signal IS$_2$ output from the latch unit 1003 becomes "low," and the strobe control signal C$_{DS}$ is deactivated to high.

The counter control signal generation unit 1005 includes first and second transmitters 1005a and 1005c, and first and second latches 1005b and 1005d. The first transmitter 1005a transmits the second intermediate signal IS$_2$ in response to a falling edge of the inverted clock signal /CLK. The first latch 1005b latches a signal transmitted by the first transmitter 1005a. The second transmitter 1005c transmits an output signal of the first latch 1005a in response to a rising edge of the inverted clock signal /CLK. The second latch 1005d latches a signal transmitted by the second transmitter 1005c, and then generates a counter control signal C$_{COUNTER}$. Here, the inverted clock signal /CLK is an inverted signal of an external clock signal CLK.

Figure 13:
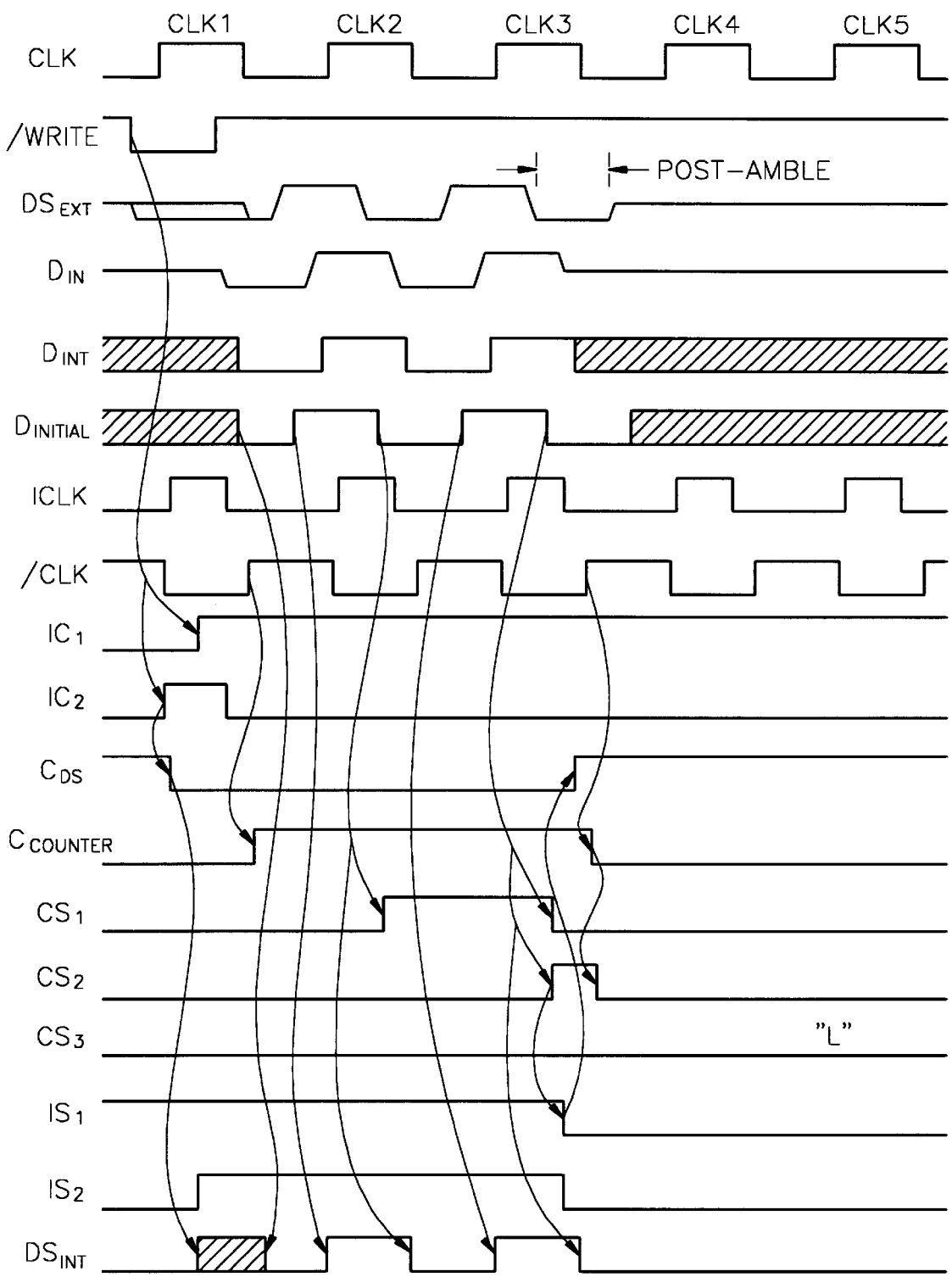
FIG. 13 is a timing diagram of the main terminal, i.e., the significant nodes, of FIG. 12 to generate internal data and an internal data strobe signal of the input circuit according to a preferred embodiment of the present invention.

Referring to FIG. 13, the data burst in this embodiment is four. Thus, the burst signal B$_4$ is high, and burst signals B$_2$ and B$_8$ are "low." Also, the mode is DDR, so that every level transition of the initial data strobe signal DS$_{INITIAL}$ represents a data input.

When the first input command signal IC$_1$ is high, the second intermediate signal IS$_2$ is latched to high, and the strobe control signal C$_{DS}$ is activated to "low." When the second input command signal IC$_2$ is activated to high and the initial data strobe signal DS$_{INITIAL}$ is activated and deactivated twice, respectively, that is, when four input data bits are set up, the first counting signal CS$_1$ becomes "low" and the second counting signal CS$_2$ becomes "high."

At this time, the level of the first intermediate signal IS$_1$ is transited to "low," and the second intermediate signal IS$_2$ becomes "low." The strobe control signal C$_{DS}$ is deactivated to "high." The counter control signal C$_{COUNTER}$ is deactivated to "low," in response to a rising edge of the inverted clock signal /CLK. The pre-counter 707 and the first and second main counters 703 and 705 are reset, so that first to third counting signals CS$_1$–CS$_3$ become "low."

Figure 11:
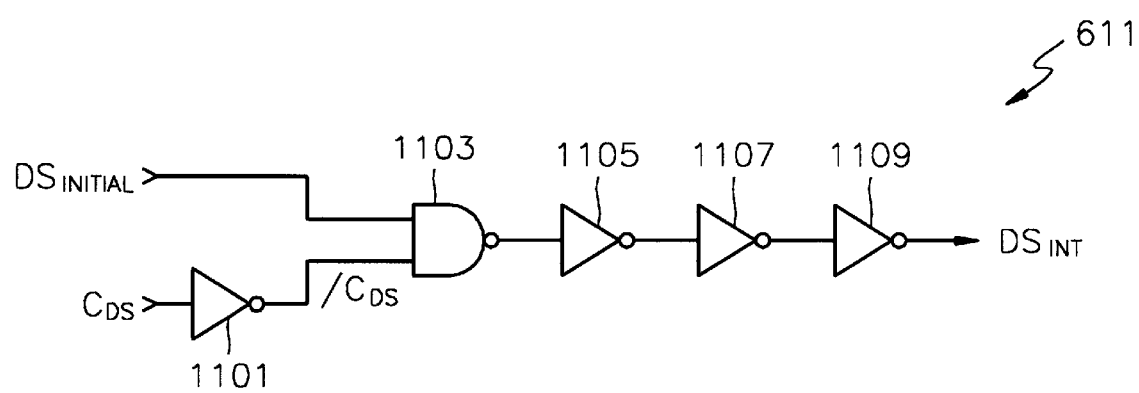
FIG. 11 is a detailed circuit diagram of the internal strobe generation circuit of FIG. 6.

Referring to FIG. 11, the internal strobe generation circuit 611 includes a logic gate 1103 and inversion buffers 1105, 1107, and 1109. The logic gate 1103 is enabled in response to the activation of the strobe control signal C$_{DS}$ to "low," and responds to the data strobe signal DS$_{INITIAL}$. Thus, the logic gate 1103 is disabled when the strobe control signal C$_{DS}$ is deactivated to "high," and does not respond to the data strobe signal. Preferably, the logic gate 1103 is a NAND gate to which an inverted strobe control signal /C$_{DS}$ and the initial data strobe signal DS$_{INITIAL}$ are input signals. The inversion buffers 1105, 1107, and 1109, which are preferably each comprised of an inverter, operate to invert the output signal of the logic gate 1103, and supply the inverted signals as an internal data strobe signal DSINT to the data setup circuit 613 (see FIG. 6).

Figure 12:
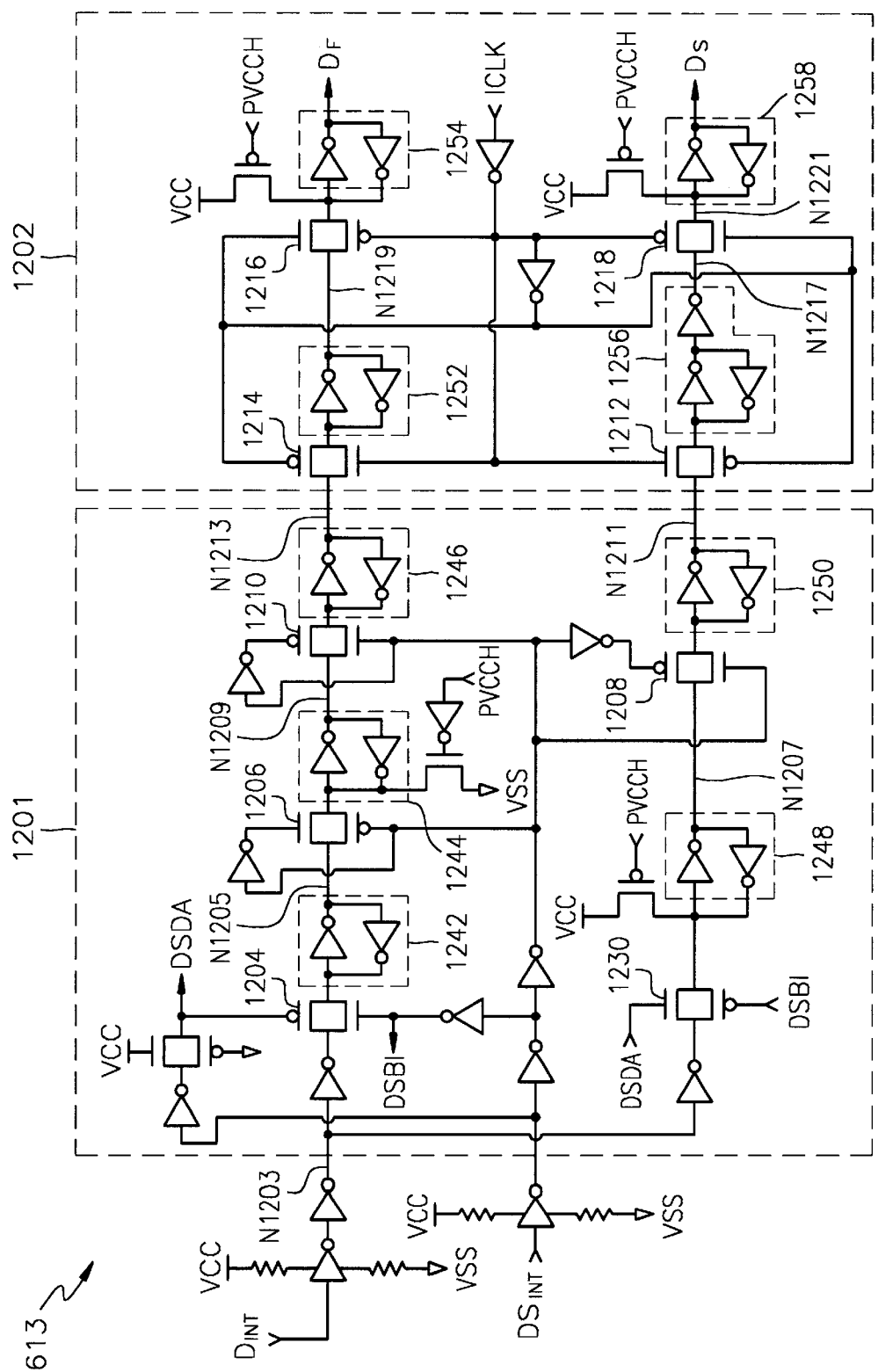
FIG. 12 is a detailed circuit diagram of the data setup circuit of FIG. 6.

Referring to FIG. 12, the data setup circuit 613 includes a strobe responding unit 1201 and a clock responding unit 1202.

The strobe responding unit 1201 transmits internal data D$_{INT}$ in synchronization with the falling edges of the internal data strobe signal DS$_{INT}$, to the clock responding unit 1202 via first path N1203→N1205→N1209→N1213. The strobe responding unit 1201 transmits the internal data D$_{INT}$ in synchronization with the rising edges of the internal data strobe signal DS$_{INT}$, to the clock responding unit 1202 via second path N1203→N1207→N1211.

In the first path N1203→N1205→N1209→N1213, transmission gates 1204 and 1210, and the transmission gate 1206, are alternately arranged transmission gates 1204 and 1210 are turned on in response to the falling edges of the internal data strobe signal DS$_{INT}$. Transmission gate 1206 is turned on in response to the rising edges of the internal data strobe signal DS$_{INT}$.

Latches 1242, 1244 and 1246, to the rear of the transmission gates 1204, 1206 and 1210, latch data transmitted by the transmission gates 1204, 1206 and 1210. Thus, odd-numbered input internal data $D_{INT}$ or even-numbered input internal data $D_{INT}$ are sequentially transmitted, in response to the transition of the internal data strobe signal $DS_{INT}$.

In the second path N1203→N1207→N1211, a transmission gate 1230, and a transmission gate 1208, are alternately arranged. Transmission gate 1230 is turned on in response to a rising end of the internal data strobe signal $DS_{INT}$. Transmission gate 1208 is turned on in response to a falling end of the internal data strobe signal $DS_{INT}$.

Latches 1248 and 1250 to the rear of the transmission gates 1230 and 1208, latch data transmitted by the transmission gates 1230 and 1208. Thus, odd-numbered internal data $D_{INT}$ or even-numbered internal data are sequentially transmitted, in response to the transition of the internal data strobe signal $DS_{INT}$.

According to the data setup circuit of FIG. 12, the odd-numbered internal data $D_{INT}$ is transmitted through the first path N1203→N1205→N1209→N1213, and the even-numbered internal data $D_{INT}$ is transmitted through the second path N1203→N1207→N1211.

The clock responding unit 1202 is composed of a third path N1213→N1219→$D_F$ and a fourth path N1211→N1217→N1221→$D_S$. The third path N1213→N1219→$D_F$ transmits data that is first transmitted through the first path N1203→N1205→N1209→N1213 of the strobe responding unit 1201 in response to the internal clock signal ICLK. The third path includes transmission gates 1214 and 1216, which are turned on when the internal clock signal ICLK is low and high, respectively. Also, latches 1252 and 1254, to the rear of the transmission gates 1214 and 1216, latch data transmitted by the transmission gates 1214 and 1216.

The fourth path N1211→N1217→N1221→$D_S$ transmits data that has first been transmitted through the second path N1203→N1207→N1211 of the strobe responding unit 1201, in response to the internal clock signal ICLK. The fourth path includes transmission gates 1212 and 1218, which are turned on when the internal clock signal ICLK is "low" and "high," respectively. Also, latches 1256 and 1258, to the rear of the transmission gates 1212 and 1218, latch data transmitted by the transmission gates 1212 and 1218.

As described above, the data burst in the preferred embodiment described in FIG. 13 is four. Referring to FIG. 13, when an input command is generated, the first input command signal $IC_1$ is generated as a pulse, and the second input command signal $IC_2$ is activated to "high." The strobe control signal $C_{DS}$ is activated to "low" by activation of the first input command signal $IC_1$, and the activation state of the strobe control signal $C_{DS}$ is maintained due to activation of the second input command signal $IC_2$. Also, a counter control signal $C_{COUNTER}$ is activated to high by activation of the first and the second input command signals $IC_1$, $IC_2$ and the inverted clock signal /CLK. The logic state of the first to third counting signals $CS_i$, where i=1 to 3, is determined, corresponding to the number of input data.

When the strobe control signal $C_{DS}$ is "low," the internal data strobe signal $DS_{INT}$ responds to the initial data strobe signal $DS_{INITIAL}$. When data having a length the same as that of a predetermined burst is input, the strobe control signal $C_{DS}$ is deactivated to "high." Thus, the internal data strobe signal $DS_{INT}$ is kept low, even though the data strobe signal /DS is in the state of "high"-impedance after post-amble has been passed.

Thus, when the internal data $D_{INT}$ is in the high-impedance state, the internal data strobe signal $DS_{INT}$ is not transited or in the high-impedance state. Therefore, parallel data $D_F$ and $D_S$ output from the data setup circuit 613 cannot be in the high-impedance state.

Due to a data input circuit and a method for inputting data according to the present invention, the number of input data bits is counted, and a response of data input to the data strobe signal is interrupted after the burst length. Therefore, delay time of the data input is reduced, which increases a data setup margin, and prevents data of "high" impedance from being input to the semiconductor memory devices.

What is claimed is:

1. A data input circuit of a synchronous semiconductor memory device that synchronizes with an external clock signal, comprising:

a control signal generation circuit that receives burst length information, input command signals, and generates a strobe control signal that is activated during the input of data of a predetermined burst length;

an internal strobe generation circuit, enabled in response to the strobe control signal, that synchronizes with an external data strobe signal to generate an internal data strobe signal that is disabled when data of a predetermined burst length is input; and a data setup circuit for converting sequentially-received data into parallel data in response to the internal data strobe signal.

2. A data input circuit, as recited in claim 1, wherein the control signal generation circuit comprises:

an input controller for receiving the input command signals and supplying the strobe control signal and a counter control signal; and a burst counter, enabled in response to the counter control signal, for counting a number of external data sequentially received and supplying the counted number, as one or more counting signals, to the input controller, wherein the counter control signal is enabled in response to a first input clock signal after one of the input command signals is generated, and is disabled in response to a first clock after a predetermined number of burst data are input.

3. A data input circuit, as recited in claim 2, wherein the input controller comprises:

a counting responding unit for generating a first internal signal in response to the one or more counting signals, the first internal signal representing the predetermined burst length of the input data;

a latch unit, enabled in response to one of the input command signals, for latching the first internal signal, and supplying a second internal signal and the strobe control signal; and a counting control signal generation unit, enabled in response to one of the input command signals, for receiving the second internal signal and supply the second internal signal as the counter control signal after a predetermined time.

4. A data input circuit, as recited in claim 3, wherein the strobe control signal is generated by inverting the second internal signal.

5. A data input circuit, as recited in claim 3, wherein the latch unit comprises:

a first logic gate enabled by the second input command signal and responding to the first internal signal; and a second logic gate enabled by the first input command signal and responding to an output of the first logic gate to generate the second internal signal, wherein the first input command signal is generated as a pulse in response to generation of an input command, and the second input command signal is activated in response to the generation of the input command, and the activation is maintained during the input of data for the interval of the burst length.

6. A data input circuit, as recited in claim 5, wherein the counting control signal generation unit comprises:

a first transmission unit for transmitting the second internal signal as a first transmitted signal in response to a first transition of the external clock signal;

a first latch for latching the first transmitted signal;

a second transmission unit for transmitting the first transmitted signal as a second transmitted signal in response to a second transition of the external clock signal; and a second latch for latching the second transmitted signal to generate the counting control signal, wherein the direction of the first transition is opposite to that of the second transition.

7. A data input circuit, as recited in claim 1, wherein the internal strobe generation circuit includes a logic gate enabled by the strobe control signal, and responding to the external data strobe signal.

8. A data input circuit, as recited in claim 1, wherein the data setup circuit includes:

a strobe response unit for transmitting the sequentially-received data through one of two or more paths, in response to the internal data strobe signal; and a clock responding unit for generating the parallel data by synchronizing the sequentially-received data transmitted through the two or more paths with the external clock signal.

9. A data input circuit, as recited in claim 1, further comprising:

a data input buffer for buffering the serially-received input data before it is supplied to the data setup circuit; and a data strobe buffer for buffering the strobe control signal before it is supplied to the internal strobe generation circuit.

10. A method of operating a synchronous semiconductor memory device (SDRAM), comprising:

receiving a plurality of data in response to a predetermined data strobe signal;

counting the number of received data; and interrupting receipt of the data when a number of data corresponding to a burst length have been received.

* * * * *